United States Patent
Shimomura

(10) Patent No.: US 6,780,685 B1
(45) Date of Patent: Aug. 24, 2004

(54) SEMICONDUCTOR DEVICE AND MANUFACTURING METHOD THEREOF

(75) Inventor: Narakazu Shimomura, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/638,390

(22) Filed: Aug. 12, 2003

(30) Foreign Application Priority Data

Mar. 27, 2003 (JP) ........................................ 2003-088671

(51) Int. Cl.[7] .......................... H01L 21/20; H01L 21/22; H01L 29/167
(52) U.S. Cl. ....................... 438/141; 438/414; 438/549; 257/655; 257/610; 257/328; 257/355
(58) Field of Search ................................. 257/328, 409, 257/494, 553, 585, 593, 610, 655, 355; 438/140, 141, 414, 546–549

(56) References Cited

U.S. PATENT DOCUMENTS

| 6,229,182 | B1 | * | 5/2001 | Van Lieverloo | ............ 257/355 |
| RE37,477 | E | * | 12/2001 | Tailliet et al. | .............. 361/111 |
| 6,338,986 | B1 | * | 1/2002 | Kawazoe et al. | ........... 438/133 |
| 6,429,490 | B2 | * | 8/2002 | Sawahata | ................... 257/356 |
| 6,693,330 | B2 | * | 2/2004 | Shimomura | ................. 257/357 |

FOREIGN PATENT DOCUMENTS

JP  61(1986)-35568  7/1984

* cited by examiner

Primary Examiner—Matthew Smith
Assistant Examiner—Lee Calvin
(74) Attorney, Agent, or Firm—Nixon & Vanderhye, P.C.

(57) ABSTRACT

A semiconductor device has a semiconductor substrate of a first conductivity; and a first electrode formation region and a second electrode formation region formed adjacent to an inner surface of the semiconductor substrate. The first electrode formation regions and the second electrode formation regions are isolated from each other via an element isolation region. An upper first-type impurity layer and a lower first-type impurity layer are formed in one of the first electrode formation region and the second electrode formation region, the lower first-type impurity layer has a different first-type impurity concentration from the upper first-type impurity layer and is formed under the upper first-type impurity layer. A second-type impurity layer and a first-type impurity layer are formed in the other electrode formation region and the first-type impurity layer is formed under a part of the second-type impurity layer having second-type impurities.

8 Claims, 6 Drawing Sheets

○ Present invention
● Prior-Art

○ Present invention

SEMICONDUCTOR DEVICE AND MANUFACTURING METHOD THEREOF

CROSS-REFERENCES TO RELATED APPLICATIONS

This application is related to Japanese Patent Applications No. 2003-88671, filed on Mar. 27, 2003, whose priority is claimed under 35 USC §119, the disclosure of which is incorporated by reference in their entirety.

BACKGROUND OF THE INVENTION

1. Field of the Invention

The present invention relates to a semiconductor device, and more particularly, it relates to a semiconductor device and a manufacturing method thereof which can be used as an input/output protection circuit for preventing an electrostatic breakdown.

2. Description of Related Art

Conventionally, in order to prevent an electrostatic breakdown of the semiconductor device, a protection circuit using a diode is provided to each input/output terminal of a semiconductor device. An example of conventional protection circuits is shown in FIG. 8. This protection circuit has a diode D in parallel to a gate electrode G of a transistor connected to an input terminal. A breakdown voltage of the diode D is set lower than a gate destruction voltage so that a destruction current applied from the input terminal is fed to the diode D but not to the gate electrode G for protection of the gate electrode G.

A breakdown current path 6 of a conventional diode manufactured by a well-known planar technique is shown in FIG. 9. In this figure, a breakdown current flow is localized in a curvature 5 (a region inside a dotted circle) at which a p-n junction is present. The above-mentioned phenomenon is caused by the fact that the field intensity is high at the p-n curvature 5, so that the p-n curvature 5 is lower than a bottom portion 7 in breakdown voltage. In this diode where the breakdown current flows in the small region inside a dotted circle, to increase the breakdown current, it is necessary to increase the area of the protection circuit itself and thereby increase the area of a chip.

Recently, the reduction in chip area has been progressed in accordance with the improvements in the techniques for manufacturing the semiconductor device, and the area of the protection circuit has been forming an increasing proportion of a total area of the semiconductor device (chip area). Moreover, since a protection circuit is generally provided for each input/output terminal, the number of the input/output terminals increases as the semiconductor device becomes more advanced, and the area of the protection circuit becomes increasingly larger. Thus, the need was felt to reduce the area of the protection circuit in order to reduce the chip area.

To meet this demand, a gate protection diode in which the breakdown current flows through a bottom portion of a p-n junction has been proposed (Japanese Unexamined Patent Publication No. SHO 61-35568).

FIG. 10 shows a breakdown current path of a diode shown in the above-mentioned patent publication. In this prior art, the breakdown voltage of a bottom portion 15 is set lower than that of the p-n junction curvature 5 by setting an impurity concentration of the p-n junction bottom portion 15 locally higher than that of a p-n junction curvature 5 by single or double figures so that the breakdown current flows through a large area portion of the junction bottom portion 15.

However, such a conventional manufacturing method as described in the above-mentioned patent publication has a problem that a large breakdown current can not flow since a resistance value of a P-type semiconductor region under an anode electrode 11 is high.

SUMMARY OF THE INVENTION

The present invention is to provide a semiconductor device and a manufacturing method thereof which allows a large breakdown current to flow by setting an impurity concentration of a P-type semiconductor under an anode electrode high and thereby decreasing a resistance value of the same portion.

In a first aspect, the present invention provides a semiconductor device comprising: a semiconductor substrate of a first conductivity, a first electrode formation region and a second electrode formation region formed adjacent to an inner surface of the semiconductor substrate, wherein the first electrode formation regions and the second electrode formation regions are isolated from each other via an element isolation region, in one of the first electrode formation region and the second electrode formation region an upper first-type impurity layer and a lower first-type impurity layer are formed, the lower first-type impurity layer has a different first-type impurity concentration from the upper first-type impurity layer and is formed under the upper first-type impurity layer, in the other electrode formation region a second-type impurity layer and a first-type impurity layer are formed and the first-type impurity layer is formed under a part of the second-type impurity layer having second-type impurities.

According to this aspect of the present invention, the large breakdown current can flow between the first electrode formation region and the second electrode formation region since a portion having a high impurity concentration is formed in the first electrode formation region. Therefore, when the semiconductor device of the present invention is used as a protection circuit, the protection circuit of the present invention can be smaller than the conventional protection circuits in area.

DESCRIPTION OF THE PREFERRED EMBODIMENTS

Figure 1:
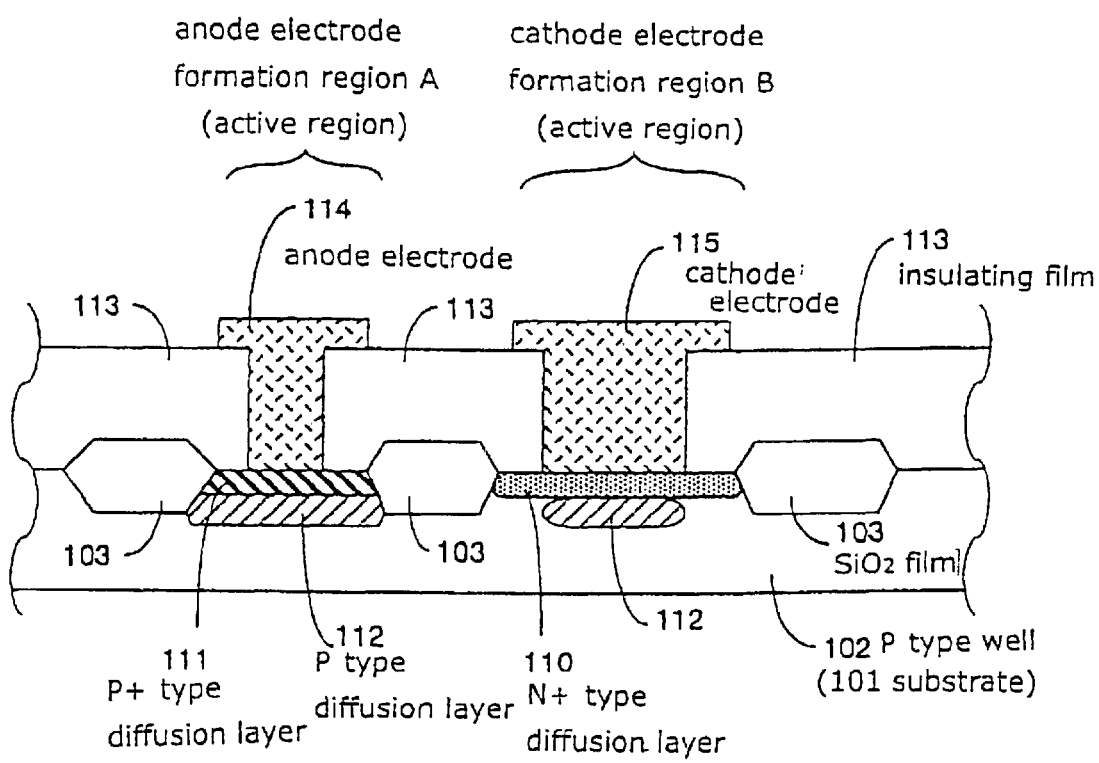
FIG. 1 is a sectional view showing the construction of a semiconductor device according to one embodiment of the present invention.

In this invention, in order to cause a large breakdown current to flow between a first electrode formation region and a second electrode formation region, it is preferable that an upper first-type impurity layer formed in one of the electrode formation regions is set higher than a lower first-type impurity layer formed thereunder in first-type impurity concentration.

In a second aspect, the present invention provides a semiconductor device comprising: a semiconductor substrate of a P-type conductivity; an anode electrode formation region and a cathode electrode formation region which are formed adjacent to an inner surface of the semiconductor substrate, wherein the anode electrode formation region and a cathode electrode formation region are isolated from each other via an element isolation region, in the anode electrode formation region a first P-type diffusion layer and a second P-type diffusion layer are formed inside the substrate in order of increasing proximity to the inner surface of the substrate, the first P-type diffusion layer is higher than the second P-type diffusion layer in P-type impurity concentration, in the cathode electrode formation region a first N-type diffusion layer and a third P-type diffusion layer are formed inside the substrate in order of increasing proximity to the inner surface of the substrate, and the third P-type diffusion layer is formed locally in a region exclusive of the vicinity of the element isolation region inside the cathode electrode formation region.

In this aspect of the present invention, it is preferable that the first P-type diffusion layer is formed in a region from the surface of the substrate to 0.4 $\mu$m in depth, and the second P-type diffusion layer is formed in a region at a depth of about 0.4 $\mu$m to a depth of 1.0 $\mu$m below the surface of the substrate.

Since the region at the depth in a range of 0.4 $\mu$m to 1 $\mu$m under the surface of the substrate is set higher than a conventional semiconductor device in P-type impurity concentration, a breakdown current about 1.2 to 1.4 times larger than that of a conventional semiconductor device can flow. Therefore, when the semiconductor device of the present invention is used as a protection circuit having the same performance as those of the conventional semiconductor devices, the area of the protection circuit can be reduced.

In a third aspect, the present invention provides a method for manufacturing a semiconductor device comprising: an element isolation step for forming element isolation regions at predetermined intervals so as to form the anode electrode formation region and the cathode electrode formation region apart from each other on the surface of the semiconductor substrate of a P-type conductivity; a first implantation step for implanting N-type impurities into the cathode electrode formation region; a second implantation step for implanting P-type impurities into the anode electrode formation region; a third implantation step for implanting the P-type impurities throughout the anode electrode formation region and into a part of the cathode electrode formation region; a thermal diffusion step for diffusing the implanted P-type and N-type impurities by an annealing treatment, and an electrode formation step for forming an anode electrode and a cathode electrode by accumulating metal material on the semiconductor substrate in the anode electrode formation region and the cathode electrode formation region by means of sputtering.

After the third implantation step, an upper P-type impurity layer and a lower P-type impurity layer are formed inside the substrate in the anode electrode formation region. It is preferable that the upper P-type impurity layer is set higher than the lower P-type impurity layer in P-type impurity concentration.

Furthermore, in order to prevent the breakdown current from being localized in a curvature of a p-n junction as in the conventional semiconductor device, it is preferable that the P-type impurities to be implanted into the cathode electrode formation region in the third implantation step is implanted in a region in the cathode electrode formation region which is 0.5 $\mu$m or more apart from a portion in contact with the element isolation region.

In a fourth aspect, the present invention provides the semiconductor device wherein on the semiconductor substrate an anode electrode and a cathode electrode are formed in the anode electrode formation region and the cathode electrode formation region, respectively, and a diode formed of the anode electrode and the cathode electrode is used as a protection circuit for input/output terminals.

The following describes embodiments of the present invention in accordance with figures. However, it should be understood that the present invention is not limited by the following description of the embodiments.

In the following description of the embodiments, a first conductivity refers to a P-type and second conductivity refers to an N-type. However and the first conductivity can refer to the N-type and the second conductivity can refer to the P-type.

In other words, not only a P-type substrate but an N-type substrate can be used as a semiconductor substrate to constitute a semiconductor device, and the same functions and effects as shown in the following embodiments can be obtained even when the N-type substrate is used.

Construction of Semiconductor Device

FIG. 1 is a sectional view showing the semiconductor device according to one embodiment of the present invention.

In this embodiment, a so-called P-type well 102 (P-type substrate) containing P-type impurities is used as a semiconductor substrate 101. In other words, the first conductivity is a P-type.

As shown in FIG. 1, a plurality of element isolation regions 103 comprising an $SiO_2$ layer are formed on the surface of the P-type well 102 at predetermined intervals. Regions between these element isolation regions 103 are active regions.

An electrode is formed in the active region. In the present invention, the active regions comprise at least a region in which an anode electrode 114 is formed (an anode electrode formation region A) and a region in which a cathode electrode 115 is formed (a cathode electrode formation region B).

Inside the substrate in the anode electrode formation region A, a $P^+$-type diffusion layer 111 having a relatively high P-type impurity concentration and a P-type diffusion layer 112 having a relatively low P-type impurity concentration are formed in this order when viewed from the surface of the substrate.

Since the semiconductor device of the present invention can be used as a protection circuit for semiconductor parts of various purposes, depths of these two diffusion layers can not be uniquely determined. However, the P+-type diffusion layer 111 may be, for example, about 0.4 μm in depth from the surface of the substrate, and the P-type diffusion layer 112 may be at, for example, a depth of about 0.4 μm to 1.0 μm from the surface of the substrate.

Further, the P-type impurity concentration of the P+-type diffusion layer 111 is set to, for example, about $1.0 \times 10^{20}$ to $1.0 \times 10^{17}$ per 1 cm$^3$, and the P-type impurity concentration of the P-type diffusion layer 112 is set to, for example, about $1.0 \times 10^{17}$ to $1.0 \times 10^{16}$ per 1 cm$^3$.

By setting the concentration and the depth of the two diffusion layers (111 and 112) as described above, the impurity concentration of the P-type diffusion layer 112 becomes about one figure higher than that of the P-type well 102, and therefore the resistance value of the anode electrode formation region can be lowered and a large breakdown current can flow.

In the anode electrode formation region A shown in FIG. 1, the anode electrode 114 is formed in an opening of an insulating film 113 and on a part of the P+-type diffusion layer 111.

Inside the substrate in the cathode electrode formation region B, an N+-type diffusion layer 110 having N-type impurities implanted therein and a P-type diffusion layer 112 having P-type impurities implanted therein are formed in this order when viewed from the surface of the substrate.

In this embodiment, the N+-type diffusion layer 110 is, for example, a region of about 0.40 μm in depth from the surface of the substrate and the P-type diffusion layer 112 under the N+-type diffusion layer is, for example, a region at a depth of about 0.40 μm to 1.0 μm from the surface of the substrate.

Furthermore, the N-type impurity concentration of the N+-type diffusion layer 110 is set to, for example, about $1.0 \times 10^{20}$ to $1.0 \times 10^{17}$ per 1 cm$^3$ and the P-type impurity concentration of the P-type diffusion layer 112 is set to, for example, about $1.0 \times 10^{17}$ to $1.0 \times 10^{16}$ per 1 cm$^3$.

Though the N+-type diffusion layer 110 is formed across the entire cathode electrode formation region sandwiched between two element isolation regions 103, the P-type diffusion layer 112 under the N+-type diffusion layer 110 is formed in a part of the cathode electrode formation region B. Particularly, it is preferable that the P-type diffusion layer 112 is not formed in a portion close to the border of the element isolation region 103. By doing so, a breakdown current flow is kept from being localized in a curvature of a p-n junction when this semiconductor device of the present invention is used as a diode for the protection circuit.

For example, it is preferable that a region for forming the P-type diffusion layer 112 in the cathode electrode formation region B is a region at least about 0.5 μm or more apart from the element isolation region 103. By setting a limitation on the region for forming the P-type diffusion layer 112, the breakdown current can flow in a large area under the P-type diffusion layer 112 in the cathode electrode formation region B, but not in the curvature of the p-n junction. Further, in the cathode electrode formation region B, the cathode electrode 115 is formed in an opening of the insulating film 113 and on the P-type diffusion layer 112.

Manufacturing Method of Semiconductor Device

Figure 2:
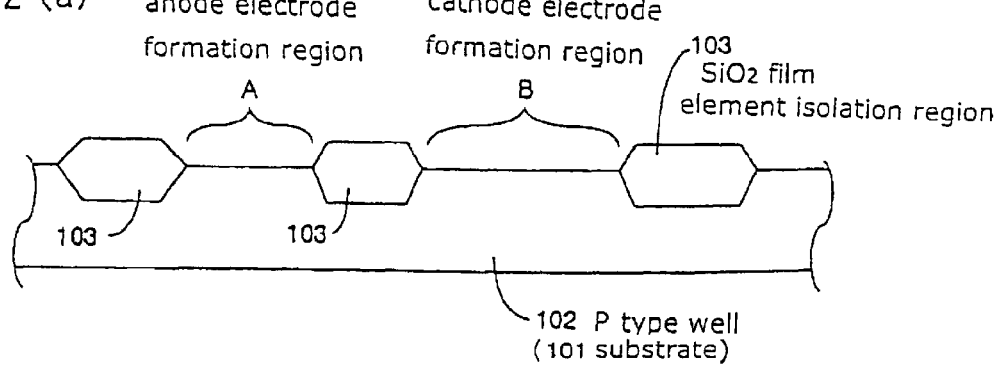
FIGS. 2(a)–2(c) are explanatory views showing the manufacturing steps of a semiconductor device according to one embodiment of the present invention.
Figure 2:
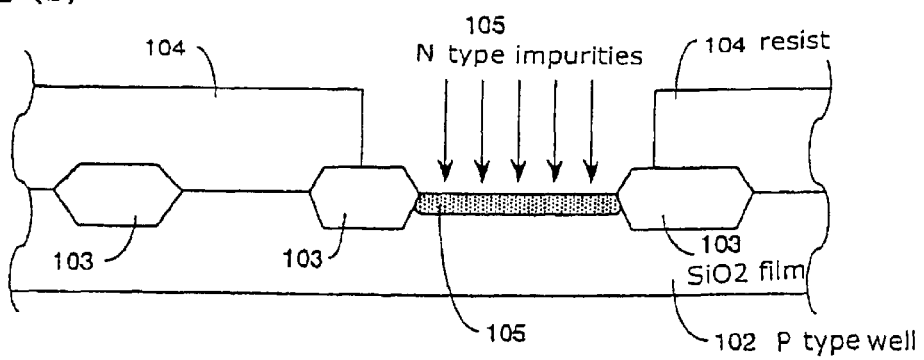
Figure 2:
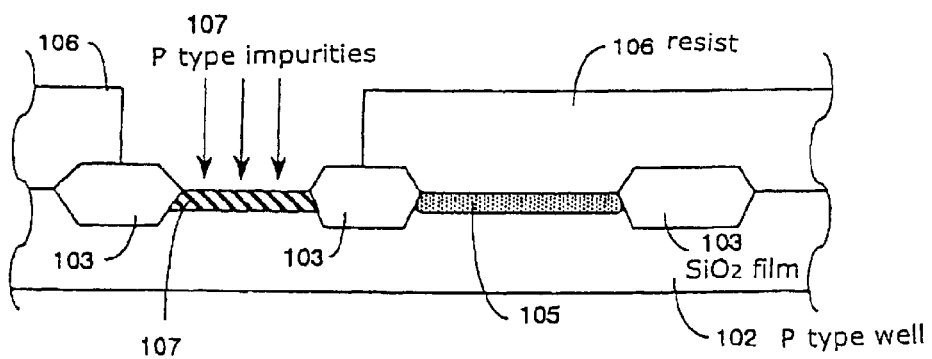
Figure 3:
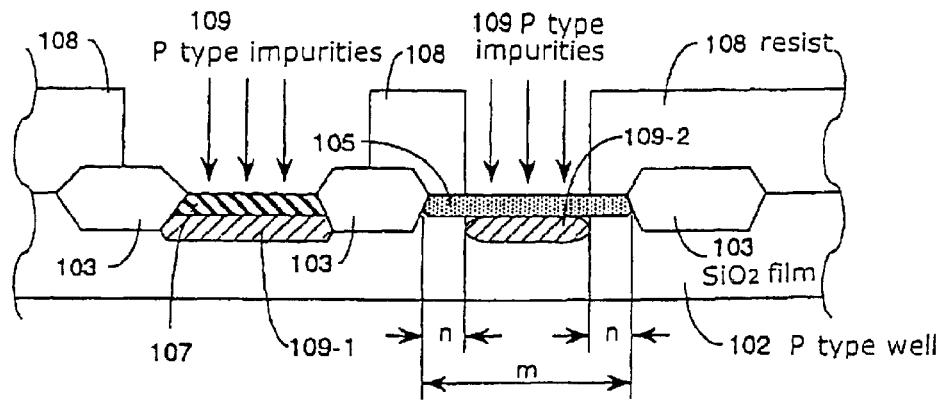
FIGS. 3(a)–3(c) are explanatory views showing the manufacturing steps of a semiconductor device according to one embodiment of the present invention.
Figure 3:
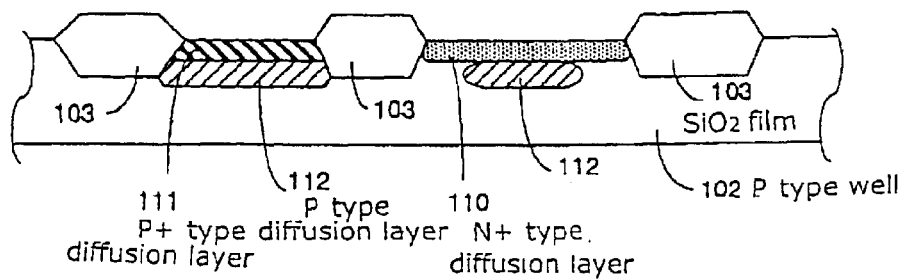
Figure 3:
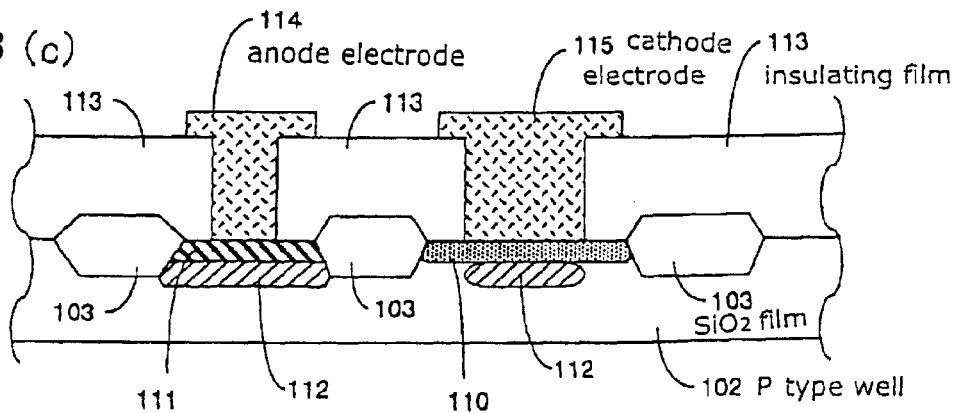

FIGS. 2 and 3 are explanatory views showing manufacturing steps of the semiconductor device according to one embodiment of the present invention. This semiconductor device is a diode comprising an anode electrode and a cathode electrode.

FIG. 2(a) shows an element isolation step. First, the semiconductor substrate 101 such as silicon substrate is prepared, and then P-type impurities such as boron are implanted into this semiconductor substrate 101 to form the P-type well 102. Next, the SiO$_2$ film 103 having a thickness of about 0.4 μm is formed in a predetermined region on the surface of the P-type well 102 by a LOCOS method to isolate elements.

Two element regions isolated by three SiO$_2$ films 103 are shown in FIG. 2(a). In this figure, an element region A is a region where the anode electrode of the diode is formed (the anode electrode formation region), and an element region B is a region where the cathode electrode of the diode is formed (the cathode electrode formation region).

FIG. 2(b) shows implantation of N-type impurities into the cathode electrode formation region. First, a resist 104 is formed by a photolithography method so as to cover the anode electrode formation region A in which the anode electrode is formed. Then, N-type impurities 105 such as phosphorus or arsenic are implanted in the P-type well 102 portion of the cathode electrode formation region B by an ion-implantation method. The amount of the implanted impurities is set to about $2 \times 10^{15}$ to $4 \times 10^{15}$ (atoms/cm$^2$). By doing so, a layer of the N-type impurities 105 is formed in the region for forming the cathode electrode which is adjacent to the surface of the P-type well 102.

FIG. 2(c) shows implantation of P-type impurities into the anode electrode formation region. First, the resist 104 formed in the previous step is removed, and then a resist 106 is formed by the photolithography method so as to cover the cathode electrode formation region B. Next, P-type impurities 107 such as boron or boron difluoride are implanted in the P-type well 102 portion of the anode electrode formation region A by the ion-implantation method. The amount of the implanted impurities is set to about $1 \times 10^{15}$ to $3 \times 10^{15}$ (atoms/cm$^2$). By doing so, a layer of the P-type impurities 107 is formed in the region for forming the anode electrode.

FIG. 3(a) shows implantation of P-type impurities. This step is carried out in order to raise the P-type impurity concentration of the anode electrode formation region A. First, the resist 106 formed in the previous step is removed, and then a resist 108 is formed by the photolithography method so as to cover a part of the cathode electrode formation region B. Next, P-type impurities 109 such as boron or boron difluoride are implanted in the anode electrode formation region A and a portion of the cathode electrode formation region B by the ion-implantation method. The amount of the implanted impurities is set to about $3 \times 10^{12}$ to $1 \times 10^{13}$ (atoms/cm$^2$).

According to this step, the P-type impurity concentration of the anode electrode formation region A can be raised and a layer 109-2 of the P-type impurities is formed in the portion of the cathode electrode formation region B. Supposing that the P-type impurity layer 109-2 is formed throughout the cathode electrode region B, the breakdown current flows in the curvature of the p-n junction as in conventional diodes and thus a large breakdown current can not flow. Therefore, the P-type impurities are only implanted in the part of the cathode electrode formation region B.

For example, when the width m of the cathode electrode formation region B is set to 10 μm as shown in FIG. 3(a), the resist 108 is formed so that the P-type impurities 109 are not present in a portion whose width n is about 0.5 μm from the edge of the SiO$_2$ film 103 serving as the element isolation region. Thus, by providing a region in which the P-type impurity 109 is not present in the portion adjacent to the element isolation region within the cathode electrode formation region B, the breakdown current can be prevented from flowing in the curvature of the p-n junction and a large breakdown current can flow in a large area portion under the cathode electrode.

In FIG. 3(a), the P-type impurity layer 107 corresponds to a first P-type diffusion layer, a P-type impurity layer 109-1 corresponds to a second P-type diffusion layer, and the P-type impurity layer 109-2 corresponds to a third P-type diffusion layer.

FIG. 3(b) shows a diffusion step. In this step, the resist 108 formed in the previous step is removed and an annealing treatment is performed at 800° C. for about 30 to 60 minutes. This process activates the implanted impurities, and therefore the $N^+$-type diffusion layer 110, the $P^+$-type diffusion layer 111, and the P-type diffusion layer 112 are formed as shown in FIG. 3(b).

FIG. 3(c) shows formation of electrodes. First, as shown in FIG. 3(c), the insulating film 113 such as an $SiO_2$ film is accumulated on the entire surface of the substrate to about 0.5 to 1.0 $\mu$m. Next, by performing a photolithography process and an etching process on the electrode formation regions (A and B), portions of the insulating film 113 in the electrode formation regions are removed to form openings.

Then, after metal material is accumulated in the openings by a sputtering method, the photolithography process and the etching process are performed. Thus, as shown in FIG. 3(c), the anode electrode 114 and the cathode electrode 115 are formed in the openings.

FIG. 3(c) is a view showing a completed construction of a diode for protecting input/output of the semiconductor device according to one embodiment of the present invention.

Figure 4:
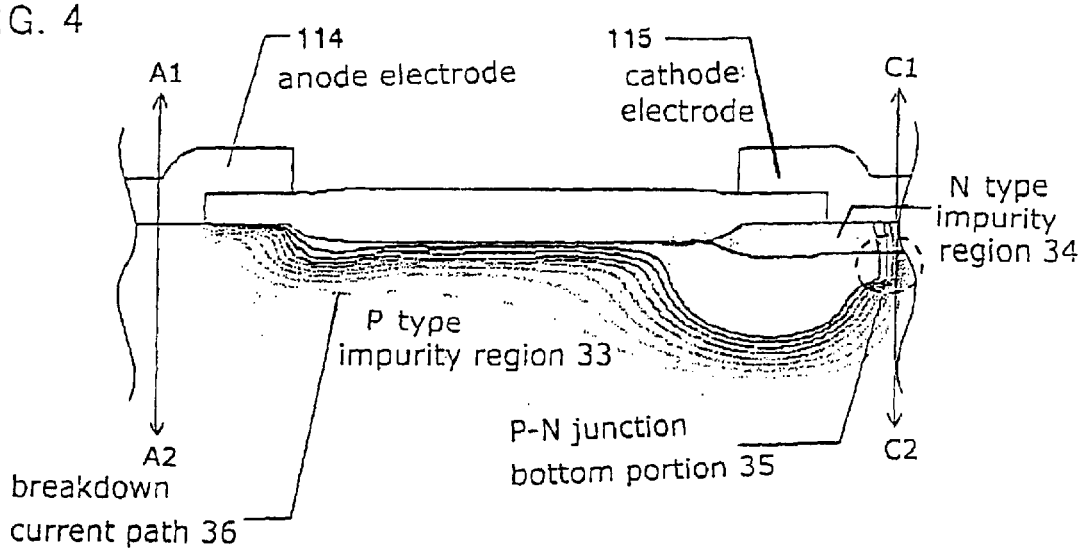
FIG. 4 is an explanatory view showing a breakdown current path of a semiconductor device of the present invention.

FIG. 4 is an explanatory view showing the breakdown current path of the semiconductor device of the present invention. It can be seen from this figure that a large breakdown current is flowing in a large area portion of the p-n junction bottom portion 35.

Figure 5:
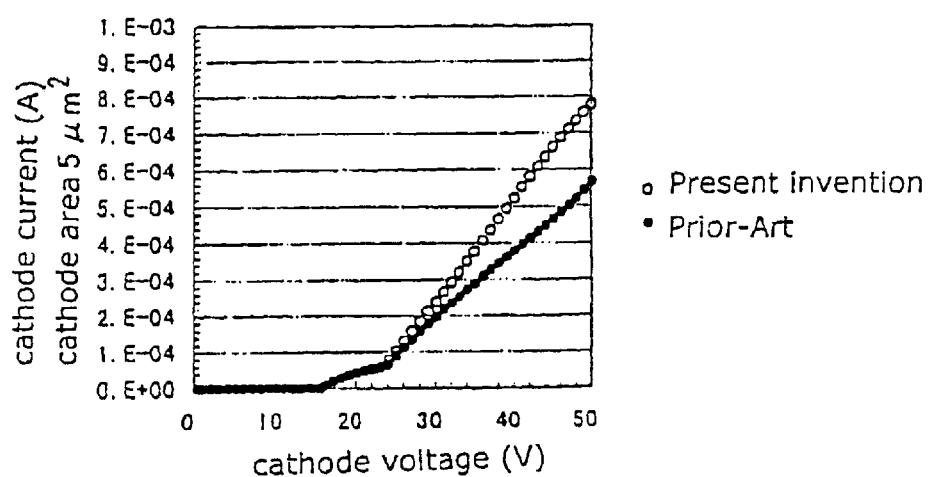
FIG. 5 is an explanatory diagram showing the reverse current characteristics of a semiconductor device according to one embodiment of the present invention.

FIG. 5 is a diagram showing the cathode voltage-current characteristics of the semiconductor device of the present invention, that is, the reverse current characteristics (breakdown current characteristics) of the diode of the present invention. According to FIG. 5, a junction breakdown begins when the cathode voltage is about 15V, and then the breakdown current (cathode current) starts to flow. Further, when the voltage is higher than about 25V, a breakdown current larger than those of conventional diodes flows, and when the cathode voltage is 50 V, a breakdown current 1.4 times larger than those of conventional diodes can flow.

It is believed that such a large breakdown current can flow because the P-type impurity concentration is set high in the vicinity of the surface of the P-type well 102 under the anode electrode 114 and thereby the resistance value of a portion under the anode electrode is reduced.

Figure 6:
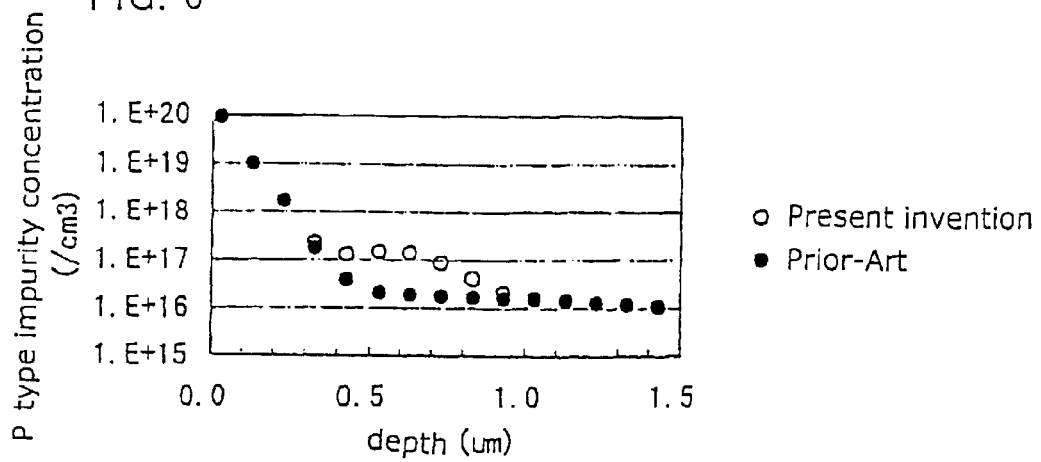
FIG. 6 is a distribution diagram of the concentration of P-type impurities in a portion under an anode electrode of a semiconductor device according to one embodiment of the present invention.
Figure 7:
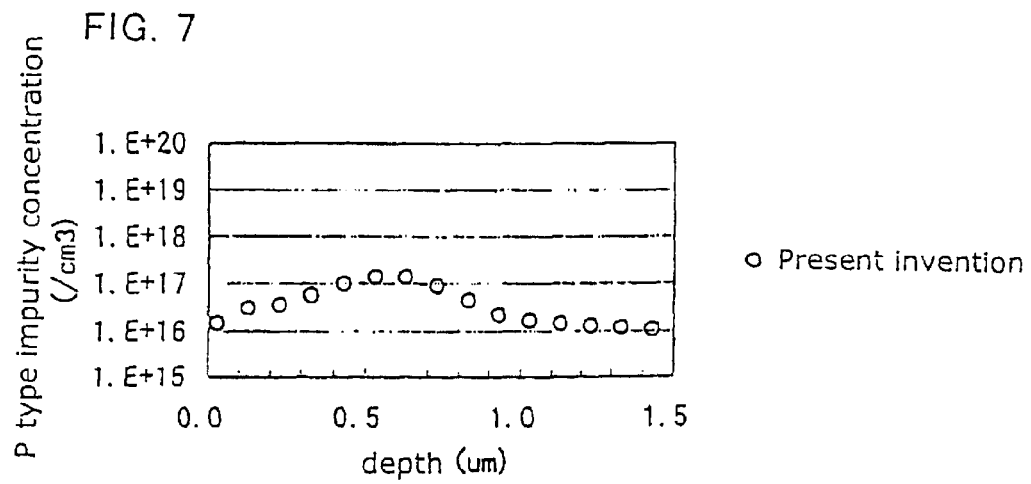
FIG. 7 is distribution diagram of the concentration of the P-type impurities in a portion under a cathode electrode of a semiconductor device according to one embodiment of the present invention.
Figure 8:
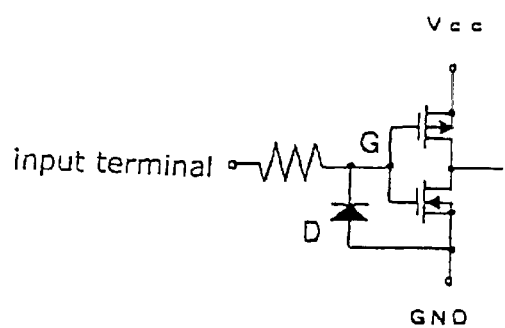
FIG. 8 is an explanatory view showing a conventional protection circuit.
Figure 9:
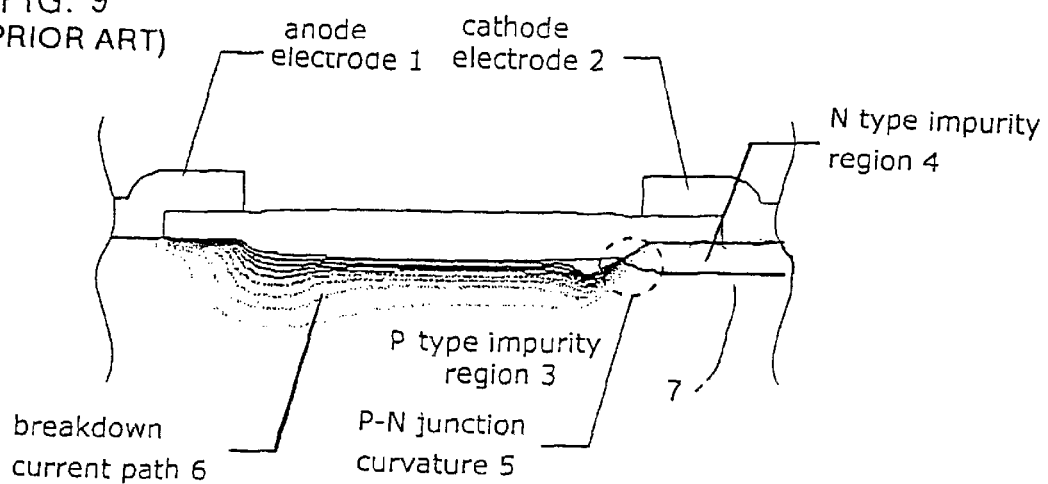
FIG. 9 is an explanatory view showing a breakdown current path of a conventional diode.

FIG. 6 is a distribution diagram showing the P-type impurity concentration in a portion under the anode electrode 114 of the semiconductor device of the present invention taken along line A1–A2 of FIG. 4. FIG. 7 is a distribution diagram showing the P-type impurity concentration in a portion under the cathode electrode 115 of the semiconductor device of the present invention taken along line C1–C2 of FIG. 4. The horizontal axis of the diagram shows the depth from the surface of the semiconductor substrate 101.

In the distribution diagram of the P-type impurity concentration in a portion under the cathode electrode shown in FIG. 7, the P-type impurity concentration is high at a depth of 0.4 $\mu$m to 0.9 $\mu$m. The conventional diode of FIG. 10 shows the same distribution pattern, and no remarkable difference is found between the two.

Figure 10:
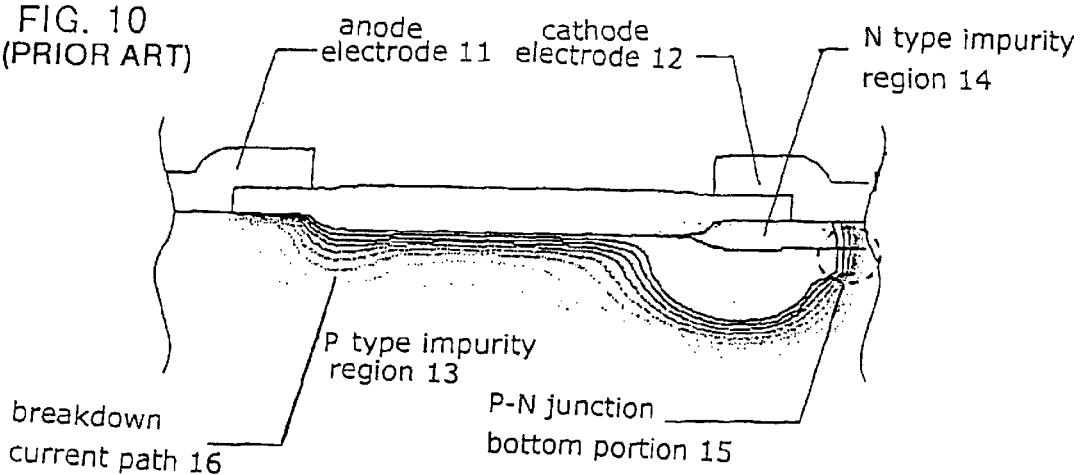
FIG. 10 is an explanatory view showing a breakdown current path of a conventional diode.

On the other hand, in the distribution diagram of the P-type impurity concentration in a portion under the anode electrode shown in FIG. 6, the present invention shows a higher P-type impurity concentration than the conventional diode shown in FIG. 10 at a depth of 0.4 $\mu$m to 0.9 $\mu$m. For example, at a depth of about 0.6 $\mu$m, the P-type impurity concentration of the present invention is nearly one figure higher than that of the conventional diode. In other words, since the P-type impurity concentration in the vicinity of the surface of the substrate under the anode electrode 114 is set higher than that of the conventional diode, the resistance value in the portion under the anode electrode can be reduced and a breakdown current larger than that of the conventional diode can flow.

For instance, it is preferable that the P-type impurity concentration in the vicinity of the substrate under the anode electrode is 10 to 100 times higher than that of the conventional diode at a depth in a range of 0.4 to 0.9 $\mu$m, and it is more preferable that the P-type impurity concentration in the vicinity of the substrate under the anode electrode is 10 times higher than that of the conventional diode at a depth of about 0.4 $\mu$m to 0.60 $\mu$m. By adjusting the P-type impurity concentration as described above, a breakdown current (cathode current) about 1.2 to 1.4 times larger than that of the conventional diode can flow with the cathode voltage in a range of 30V to 50V.

Besides, in comparison to the conventional diode shown in FIG. 10, the area of the cathode electrode of the present invention can be reduced to be about 1/1.2 times to 1/1.4 times smaller than that of the conventional diode if only the same amount of breakdown current as that of the conventional diode is required.

In other words, the area of the cathode electrode can be reduced for about 17% to 29% when compared to that of the conventional diode. Therefore, when the semiconductor device of the present invention is used as a protection circuit for preventing an electrostatic breakdown of input/output terminals, the area of the protection circuit can be smaller. As a result of this, a semiconductor IC can be downsized.

According to the present invention, the large breakdown current can flow since a portion having a high impurity concentration is formed in the first electrode formation region.

Further, according to another aspect of the present invention, since the P-type impurity concentration in the vicinity of the substrate in the anode electrode forming region is locally set high, the resistance value in the portion under the anode electrode can be reduced and the breakdown current larger than that of the conventional diode can flow.

Therefore, when the semiconductor device of the present invention is used as a protection circuit, the area of the protection circuit can be reduced compared to that of the conventional diode.

What is claimed is:

1. A method for manufacturing a semiconductor device comprising:

an element isolation step for forming element isolation regions at predetermined intervals so as to form an anode electrode formation region and a cathode electrode formation region apart from each other on a surface of a semiconductor substrate of a P-type conductivity;

a first implantation step for implanting N-type impurities into the cathode electrode formation region;

a second implantation step for implanting P-type impurities into the anode electrode formation region;

a third implantation step for implanting the P-type impurities throughout the anode electrode formation region and into a part of the cathode electrode formation region;

a thermal diffusion step for diffusing the implanted P-type and N-type impurities by an annealing treatment, and an electrode formation step for forming an anode electrode and a cathode electrode by accumulating metal material on the semiconductor substrate in the anode electrode formation region and the cathode electrode formation region by means of sputtering.

2. A method for forming a semiconductor device according to claim 1, wherein an upper P-type impurity layer and a lower P-type impurity layer are formed inside the substrate in the anode electrode formation region after the third implantation step, and the upper P-type impurity layer is set higher than the lower P-type impurity layer formed thereunder in P-type impurity concentration.

3. A method of forming a semiconductor device according to claim 1, wherein the P-type impurities to be implanted into the cathode electrode formation region in the third implantation step is implanted in a region in the cathode electrode formation region which is 0.5 $\mu$m or more apart from a portion in contact with the element isolation region.

4. A semiconductor device comprising:

a semiconductor substrate of a first conductivity;

a first electrode formation region and a second electrode formation region formed adjacent to an inner surface of the semiconductor substrate, wherein the first electrode formation regions and the second electrode formation regions are isolated from each other via an element isolation region, an upper first-type impurity layer and a lower first-type impurity layer are formed in one of the first electrode formation region and the second electrode formation region, the lower first-type impurity layer has a different first-type impurity concentration from the upper first-type impurity layer and is formed under the upper first-type impurity layer, a second-type impurity layer and a first-type impurity layer are formed in the other electrode formation region and the first-type impurity layer is formed under a part of the second-type impurity layer having second-type impurities.

5. A semiconductor device according to claim 4, wherein the upper first-type impurity layer formed in one of the electrode formation regions is set higher than the lower first-type impurity layer formed thereunder in first-type impurity concentration.

6. A semiconductor device comprising:

a semiconductor substrate of a P-type conductivity;

an anode electrode formation region and a cathode electrode formation region which are formed adjacent to an inner surface of the semiconductor substrate, wherein the anode electrode formation region and a cathode electrode formation region are isolated from each other via an element isolation region, in the anode electrode formation region a first P-type diffusion layer and a second P-type diffusion layer are formed inside the substrate in order of increasing proximity to the inner surface of the substrate, the first P-type diffusion layer is higher than the second P-type diffusion layer in P-type impurity concentration;

in the cathode electrode formation region a first N-type diffusion layer and a third P-type diffusion layer are formed inside the substrate in order of increasing proximity to the inner surface of the substrate, and the third P-type diffusion layer is formed locally in a region exclusive of the vicinity of the element isolation region inside the cathode electrode formation region.

7. A semiconductor device according to claim 6, wherein the first P-type diffusion layer is formed in a region from the surface of the substrate to 0.4 $\mu$m in depth, and the second P-type diffusion layer is formed in a region at a depth of 0.4 $\mu$m to a depth of 1.0 $\mu$m below the surface of the substrate.

8. A semiconductor device according to claim 6, wherein an anode electrode and a cathode electrode are formed in the anode electrode formation region and the cathode electrode formation region, respectively, on the semiconductor substrate and a diode formed of the anode electrode and the cathode electrode is used as a protection circuit for input/output terminals.

* * * * *